United States Patent [19]

Kaestner

[11] 4,185,891
[45] Jan. 29, 1980

[54] LASER DIODE COLLIMATION OPTICS

[75] Inventor: Paul Kaestner, Huntington, N.Y.

[73] Assignee: Grumman Aerospace Corporation, Bethpage, N.Y.

[21] Appl. No.: 856,014

[22] Filed: Nov. 30, 1977

[51] Int. Cl.² .......................... G02B 27/30; H01S 3/23
[52] U.S. Cl. ................................... 350/167; 313/500; 331/94.5 H; 357/17; 362/237; 362/259; 362/800
[58] Field of Search ........................ 350/167, 169, 174; 362/800, 244, 234–240, 259, 1; 313/500, 110, 111; 331/94.5 H; 250/495, 504; 357/17–19

[56] References Cited

U.S. PATENT DOCUMENTS

| 3,239,660 | 3/1966 | Hall | 362/1 |
| 3,247,367 | 4/1966 | Rayces | 362/1 |
| 3,264,467 | 8/1966 | Mann et al. | 362/234 |
| 3,396,344 | 8/1968 | Broom | 357/18 |
| 3,513,306 | 5/1970 | Le Vantine | 362/235 |
| 3,518,419 | 6/1970 | Humphrey | 362/800 |
| 3,835,414 | 9/1974 | Ahearn | 331/94.5 H |

Primary Examiner—Ronald J. Stern
Attorney, Agent, or Firm—Bruce B. Brunda; Richard G. Geib

[57] ABSTRACT

The present invention related to optical collimating systems and has particular reference to beam compression of laser diode emission.

21 Claims, 3 Drawing Figures

LASER DIODE COLLIMATION OPTICS

BACKGROUND OF THE INVENTION

It is now well known that certain semi-conductor diodes produce electromagnetic laser radiation when an electrical current is conducted therethrough. A single diode laser does not provide a useful output, but an array of stacked diodes, which can be placed side by side with others, will produce laser intensity of high power. Since the emitted beams tend to diverge greatly and lose their intensity at a distance from the diodes various optical schemes proposed in the past collimate the divergent beam to one of negligable divergence. One such scheme is that shown in U.S. patent application Ser. No. 616,264 for "Semiconductor Laser Array" by J. T. Fulton and I. M. Kaplan which is assigned to the assignee of this application and is now abandoned. In that prior application a stack of laser diodes is located behind a lenticular convex cylindrical lens array, wherein each diode emitting plane is precisely located on the optical axial plane of the cylindrical lens, at the focal plane thereof, to collimate the laser beam in the plane perpendicular to the lenticular lens array, e.g. vertical plane. A single plane convex lens placed in front of the lenticular lens captures substantially all of the laser beams emanating therefrom and collimates the beams in the plane perpendicular to the plane of initial collimation, e.g. the horizontal plane.

SUMMARY OF THE INVENTION

The present invention is a modification of the prior invention wherein the width of laser beam is also compressed as well as collimated. The emitting plane of each diode is displaced from the optical plane of its corresponding convex cylindrical lens rather than being in the optical plane. The degree of displacement is a function of the distance of the individual cylindrical lens from the nominal optical axis of the system so that the diode images are focused as a single point on the central optical axis of the system. A negative (concave) cylindrical lens with its longitudinal axis parallel to the longitudinal axis of the convex cylindrical lenses is placed on the optical axis of the system to capture the emission of the diode before reaching the optical axis to collimate the output in the plane perpendicular to the longitudinal axis of the negative lens, e.g. vertically. The output is collimated in the orthogonal (e.g. horizontal) plane by the single plano-convex lens placed in front of the single plano-concave lens as in prior art. Also as in prior art the physical size of the system may be reduced by using telephoto principles where the focal length to the single plano-convex lens is reduced by inserting a negative cylindrical lens between the diodes and the convex lens.

The negative and positive cylindrical output lens may be combined into a single optical element if desired.

BRIEF DESCRIPTION OF THE DRAWINGS

For a more complete understanding of the invention reference may be had to the accompanying diagrams in which.

DETAILED DESCRIPTION

Figure 1:
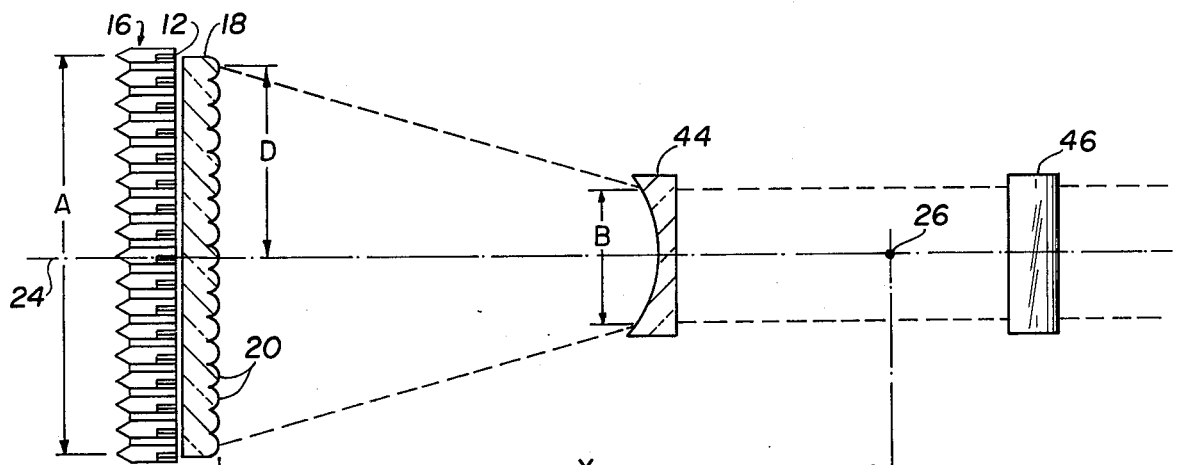
FIG. 1 shows the element of one embodiment of invention, partly in section

In FIG. 1 there is shown a plurality of linear diodes 12, such as gallium arsenide diodes, producing infra red laser radiation at their junction plane upon energization thereof. The diodes 12 are stacked one on another to establish a vertical linear diode array 16. The diode array 16 is positioned at the rear conjugate plane of a lenticular lens 18 comprising a plurality of short focal length cylindrical convex lens elements 20 which cause the radiation from diodes 16 to converge toward a common point 26 on the central optical axis 24 of the system at the forward conjugate of the lenticular lens 18.

Figure 2:
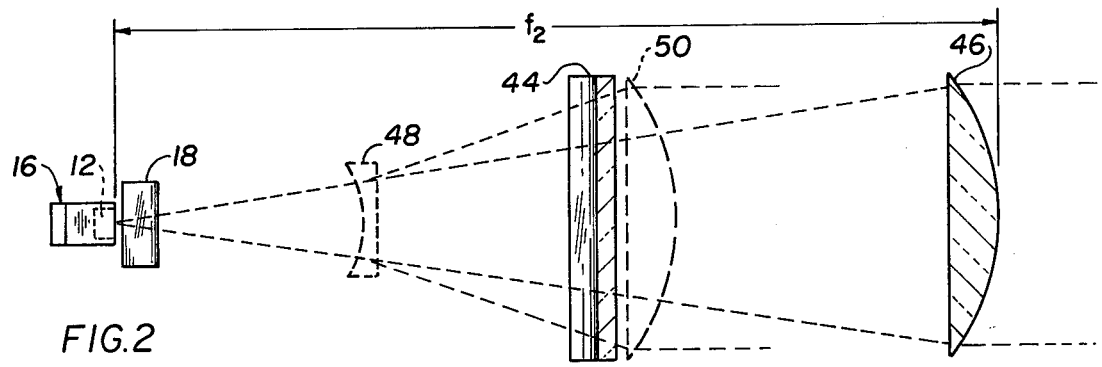
FIG. 2 is a top view of the arrangement in FIG. 1, which also shows an alternative arrangement of lens 48 and lens 50.

FIG. 2, a plan view of FIG. 1, shows the extended source of the output of the diode 12 in the plane perpendicular to the plane of FIG. 1. As well known in prior art the extended source beam may be collimated without excessive divergence by the long focal length ($f_2$) plano-convex cylindrical lens 46, whose focal plane is at the plane of the diodes 12. One alternative arrangement which may be used in place of lens 46 is the telephoto combination of a negative (concave-plano) cylindrical lens 48 and positive plano-convex cylindrical lens 50, which are shown dotted in FIG. 2. The telephoto combination provides a shorter length system of equivalent focal length for more compact packaging of the device.

Figure 3:
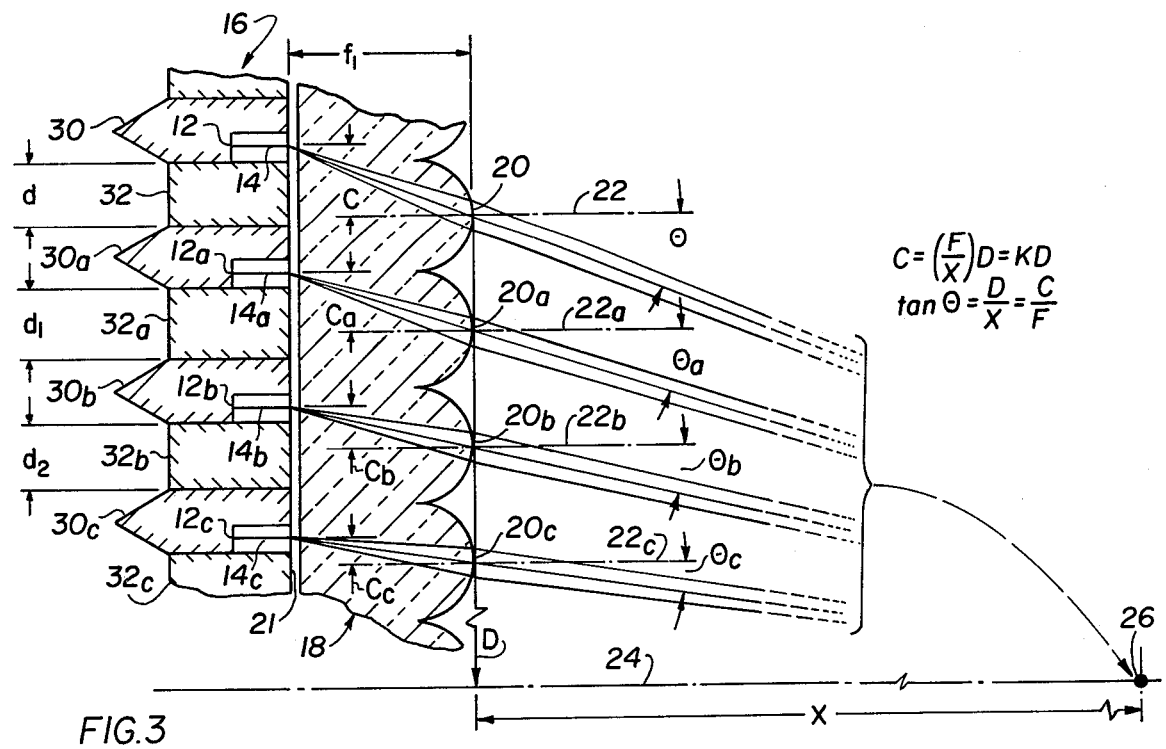
FIG. 3 is a detail of one portion of FIG. 1.

FIG. 3 shows the geometry and preferred construction of a portion of the system shown in FIG. 1 in detail. The diode stack 16 includes the diodes 12, 12a, 12b etc. which are obtained from the supplier encased in housings 30, 30a, 30b etc. The radiating junction 14 of diode 12 is positioned at the rear conjugate plane 21 of lens 20, a distance f, behind the front of lens 20 and a distance c above the optical axis 22 of lens 20. Thus, the beam from lens 20 is directed at an angle $\theta$ with respect to axis 22 where $\tan \theta = c/f_1$. The optical axis 22 is located at a distance D from the optical axis of the system so that the image of junction 14 is focussed on axis 24 at a point 26 (see FIG. 1) a distance X in front of lens 20, where $X = (f_1/c)D$. Similarly, junction 14a, 14b, 14c of diodes 12a, 12b, 12c, are displaced above the optical axes 22a, 22b, 22c of lenses 20a, 20b, 20c, respectively by distances Ca, Cb, Cc such that the images of junctions 14a, 14b, 14c, are also focused at the same point 26 on axis 24. Accordingly, since $f_1$ and X are fixed, the distances Ca, Cb, Cd, are determined by the distance Da, Db and Dc of axes 22a, 22b, 22c, above axis 24 as expressed by a transposition of the equation above i.e. $C = (f_1/x)D$ C=Ca, Cb, Cd and D=Da, Db, Dc etc. It is seen that the spacings between the optical axes 22, 22a, 22b, etc. The spacers 32, 32a, 32b between the housings 30, 30a, 30b, 30c of diodes 12, 12a, 12b, 12c are each specially tailored to make sure that the junctions 14, 14a, 14b and 14c are properly positioned with respect to the optical axes 22, 22a etc.

Referring again to FIG. 1, the energy from diode bank 16, directed as described through lens 18, is captured by the negative (concave-plano) lens 44 which has a cylindrical axis parallel to the cylindrical axis of lens 18. The virtual focal point 26 of lens 44 is at point on axis 24. The laser energy from diode bank 16 is collimated by lens 44.

Thus the energy beam is compressed from the width A at diode stack 16 to width B at the cylindrical lens 44 and the intensity of the beam is increased accordingly. Typically A=1.5B representing a 67% increase in intensity.

It should be understood that a laser diode array of the type shown generates considerable heat and must be cooled to prevent disintegration. Appropriate cooling methods are discussed in the aforementioned U.S. patent application Ser. No. 616,264 but since they form no part of this invention are not discussed herein.

It should be further understood that many changes can be made to the preferred embodiment described without departing from the spirit of the invention. For example the spacing between junctions 14, 14a, 14b, etc., be uniform with lenses 20, 20a, 20b, etc., separated by non-uniform distances to establish the proper displacement of junction 14 from plane 22 to effect the focusing of the image at about point 26. Thus the invention should not be limited by the preferred embodiment described herein but is to be defined by the scope of the appended claims.

What is claimed is:

1. In an optical collimating system having an optical axis;
    a plurality of discrete energy sources;
    means for stacking said energy sources in a linear array perpendicular to said optical axis;
    optical means for focusing an image of said energy sources at a predetermined point on said optical axis which compresses the beam of energy from said array in the plane of said array, and
    a first cylindrical negative lens interposed between said optical means and said predetermined point with its optical plane on said optical axis and perpendicular to said array which collimates said energy beam in the plane of said array.

2. The device of claim 1 wherein said optical means for focusing an image of said energy sources at a predetermined point includes a plurality of short focal length cylindrical positive lenses.

3. The device of claim 2 wherein the positive lenses are equally spaced apart;
    each of said energy sources being displaced from the optical axis of its corresponding lens by a different amount;
    the amount of displacement being determined by the distance of the optical axis of the lens from the optical axis of the device.

4. The device of claim 2 wherein the plurality of positive lenses comprises a single sheet of transparent material having a plurality of convex lenses formed on one side thereof.

5. The device of claim 1 including a long focal length positive cylindrical lens having its longitudinal axis parallel to said linear array and located in front of said negative cylindrical lens whereby the energy from said energy sources is collimated in a plane perpendicular to said linear array.

6. The device of claim 1 wherein said energy sources are laser emitting diodes.

7. The device of claim 2 wherein said energy sources are laser emitting diodes.

8. The device of claim 3 wherein said energy sources are laser emitting diodes.

9. The device of claim 4 wherein said energy sources are laser emitting diodes.

10. The device of claim 5 wherein said energy sources are laser emitting diodes.

11. In an optical collimating system having an optical axis;
    a plurality of discrete energy sources;
    means for stacking said energy sources in a linear array perpendicular to said optical axis;
    optical means for focusing an image of said energy sources at a predetermined point on said optical axis which means compress the beam of energy from said array in the plane of said array;
    a first negative cylindrical lens interposed between said optical means and said predetermined point with its optical plane on said optical axis and perpendicular to said array which collimates said energy beam in the plane of said array;
    a second negative cylindrical lens interposed on said optical axis between said optical means and said first negative cylindrical lens with its optical axis parallel to said array which diverges said beam of energy in a plane perpendicular to said array, and
    a positive cylindrical lens interposed on said optical axis in front of said first negative cylindrical lens with its optical axis parallel to said array which collimates said beam of energy in a plane perpendicular to said array.

12. The device of claim 11 wherein said energy sources are laser emitting diodes.

13. A method of providing a useful output from a plurality of light sources, said method comprising the steps of:
    stacking the sources of light in a predetermined array;
    focusing light emissions from each of the sources through an individually dedicated focusing lens toward a single common point on a central optical axis, and
    collimating the light emissions from each of the sources before said emissions reach said single common point to provide a more intense beam at distances from the sources due to negligible divergence after collimating.

14. The method as recited in claim 13 wherein the step of stacking the sources of light includes spacing the light sources at nonuniform distances to establish the proper displacement between each light source and the optical axis of its individually dedicated focusing lens to focus said light emissions at said common point.

15. The method as recited in claim 13 wherein the step of focusing light emissions includes positioning an individually dedicated positive cylindrical lens in front of each light source such that each light source is displaced from the optical axis of its dedicated lens, said displacement being determined by the distance of said light source from said central optical axis.

16. The method as recited in claim 13 wherein the step of collimating the light emissions includes positioning a negative cylindrical collimating lens on said central optical axis between said single common point and said individually dedicated focusing lenses, and transmitting said focused light emissions therethrough such that the light is collimated in a direction parallel with said central optical axis.

17. The method as recited in claim 16 wherein the step of collimating the light emissions also includes positioning a positive cylindrical lens on said central optical axis in front of said negative cylindrical collimating lens and transmitting said focused light emissions therethrough such that the light is also collimated in the orthogonal plane in a direction parallel with said central optical axis.

18. A method of providing a useful output from a plurality of light sources, said method comprising the steps of:

stacking the sources of light in a predetermined order;

focusing light emissions from each of the sources through a focusing lens toward a common point on a central optical axis;

positioning a first negative cylindrical lens on said central optical axis between said single common point and said individually dedicated focusing lenses such that the light emissions transmitted through said first negative lens are collimated in in a direction parallel with said central optical axis;

positioning a second negative cylindrical lens on said central optical axis between said individually dedicated focusing lenses and said first negative cylindrical lens such that the light emissions transmitted through said second negative lens diverge from said central optical axis, and positioning a positive cylindrical lens on said central optical axis in front of said first negative cylindrical lens such that the light emissions transmitted through said positive cylindrical lens are also collimated in the orthogonal plane in a direction parallel with said central optical axis.

19. In an optical collimating device having a central optical axis;

a plurality of discrete energy sources;

means for stacking said energy sources in a linear array perpendicular to said central optical axis;

optical means for focusing an image of said energy sources at a predetermined point on said central optical axis which compresses the beam of energy from said array in the plane of said array, and a first cylindrical negative lens interposed between said optical means and said predetermined point with its optical plane on said optical axis and perpendicular to said array which collimates said energy beam in the plane of said array in a direction parallel with said central optical axis.

20. The device of claim 19 including a long focal length positive cylindrical lens having its longitudinal axis parallel to said linear array and located on said central optical axis, in front of said negative cylindrical lens whereby the energy from said energy sources is collimated in a plane perpendicular to said linear array in a direction parallel with said central optical axis.

21. In an optical collimating system having a central optical axis;

a plurality of discrete energy sources;

means for stacking said energy sources in a linear array perpendicular to said central optical axis;

optical means for focusing an image of all of said energy sources at a single predetermined point on said central optical axis which means compress the beam of energy from said array in the plane of said array;

a first negative cylindrical lens interposed between said optical means and said predetermined point with its optical plane on said central optical axis and oriented as to collimate said energy beam in the plane of said array;

a second negative cylindrical lens interposed on said central optical axis between said optical means and said first negative cylindrical lens and oriented as to diverge said beam of energy in a plane perpendicular to said array, and a positive cylindrical lens interposed on said optical axis in front of said first negative cylindrical lens and oriented as to collimate said beam of energy in a plane perpendicular to said array.

* * * * *